US008597462B2

(12) United States Patent
Brown et al.

(10) Patent No.: US 8,597,462 B2
(45) Date of Patent: Dec. 3, 2013

(54) MOVABLE CHAMBER LINER PLASMA CONFINEMENT SCREEN COMBINATION FOR PLASMA PROCESSING APPARATUSES

(75) Inventors: Danny Brown, Brentwood, CA (US); Leonard Sharpless, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 411 days.

(21) Appl. No.: 12/785,232

(22) Filed: May 21, 2010

(65) Prior Publication Data

US 2011/0287632 A1 Nov. 24, 2011

(51) Int. Cl.
C23C 16/00 (2006.01)
C23F 1/00 (2006.01)
H01L 21/306 (2006.01)

(52) U.S. Cl.
USPC . 156/345.37; 118/715; 118/725; 156/345.33; 156/345.34

(58) Field of Classification Search
USPC ........... 156/345.33, 345.34, 345.37; 118/715, 118/725; 315/111.71
See application file for complete search history.

(56) References Cited

U.S. PATENT DOCUMENTS

| | | | |
|---|---|---|---|
| 4,842,683 A | 6/1989 | Cheng et al. | |
| 5,306,895 A * | 4/1994 | Ushikoshi et al. | 219/385 |
| 5,685,942 A | 11/1997 | Ishii | |
| 5,698,062 A | 12/1997 | Sakamoto et al. | |
| 5,710,486 A | 1/1998 | Ye et al. | |
| 5,788,799 A | 8/1998 | Steger et al. | |
| 5,865,896 A | 2/1999 | Nowak et al. | |
| 5,944,942 A | 8/1999 | Ogle | |
| 6,013,155 A | 1/2000 | McMillin et al. | |
| 6,019,060 A | 2/2000 | Lenz | |
| 6,170,429 B1 * | 1/2001 | Schoepp et al. | 118/723 R |
| 6,178,919 B1 | 1/2001 | Li et al. | |
| 6,204,607 B1 | 3/2001 | Ellingboe | |
| 6,277,237 B1 | 8/2001 | Schoepp et al. | |
| 6,288,237 B1 | 9/2001 | Hoefle et al. | |
| 6,364,954 B2 * | 4/2002 | Umotoy et al. | 118/715 |
| 6,408,786 B1 | 6/2002 | Kennedy et al. | |
| 6,422,172 B1 | 7/2002 | Tanaka et al. | |
| 6,527,911 B1 | 3/2003 | Yen et al. | |
| 6,652,713 B2 | 11/2003 | Brown et al. | |
| 6,726,805 B2 | 4/2004 | Brown et al. | |
| 6,733,620 B1 | 5/2004 | Sugiyama et al. | |
| 6,800,173 B2 | 10/2004 | Chiang et al. | |

(Continued)

FOREIGN PATENT DOCUMENTS

JP 2002-270484 A 9/2002

OTHER PUBLICATIONS

International Search Report and Written Opinion mailed Feb. 8, 2012 for PCT/US2011/000857.

*Primary Examiner* — Rakesh Dhingra

(74) *Attorney, Agent, or Firm* — Buchanan Ingersoll & Rooney PC

(57) ABSTRACT

A movable symmetric chamber liner in a plasma reaction chamber, for protecting the plasma reaction chamber, enhancing the plasma density and uniformity, and reducing process gas consumption, comprising a cylindrical wall, a bottom wall with a plurality of openings, a raised inner rim with an embedded heater, heater contacts, and RF ground return contacts. The chamber liner is moved by actuators between an upper position at which substrates can be transferred into and out of the chamber, and a lower position at which substrate are processed in the chamber. The actuators also provide electrical connection to the heater and RF ground return contacts.

15 Claims, 8 Drawing Sheets

(56) References Cited

U.S. PATENT DOCUMENTS

| | | |
|---|---|---|
| 6,910,441 B2 | 6/2005 | Jang |
| 7,009,281 B2 | 3/2006 | Bailey, III et al. |
| 7,411,161 B2 * | 8/2008 | Kim .......................... 219/444.1 |
| 7,416,677 B2 | 8/2008 | Takahashi |
| 2002/0076490 A1 * | 6/2002 | Chiang et al. .............. 427/248.1 |
| 2003/0037880 A1 * | 2/2003 | Carducci et al. ......... 156/345.43 |
| 2003/0218427 A1 | 11/2003 | Hoffman et al. |
| 2005/0121143 A1 * | 6/2005 | Daugherty et al. ....... 156/345.29 |
| 2006/0105575 A1 * | 5/2006 | Bailey et al. .................. 438/706 |
| 2006/0151114 A1 * | 7/2006 | Fink ......................... 156/345.29 |
| 2006/0231208 A1 * | 10/2006 | Ohmi et al. .............. 156/345.41 |
| 2006/0292759 A1 * | 12/2006 | Ito ................................. 438/149 |
| 2007/0000614 A1 | 1/2007 | Hatamura et al. |
| 2008/0149596 A1 | 6/2008 | Dhindsa et al. |
| 2008/0227323 A1 | 9/2008 | Kholodenko et al. |

* cited by examiner

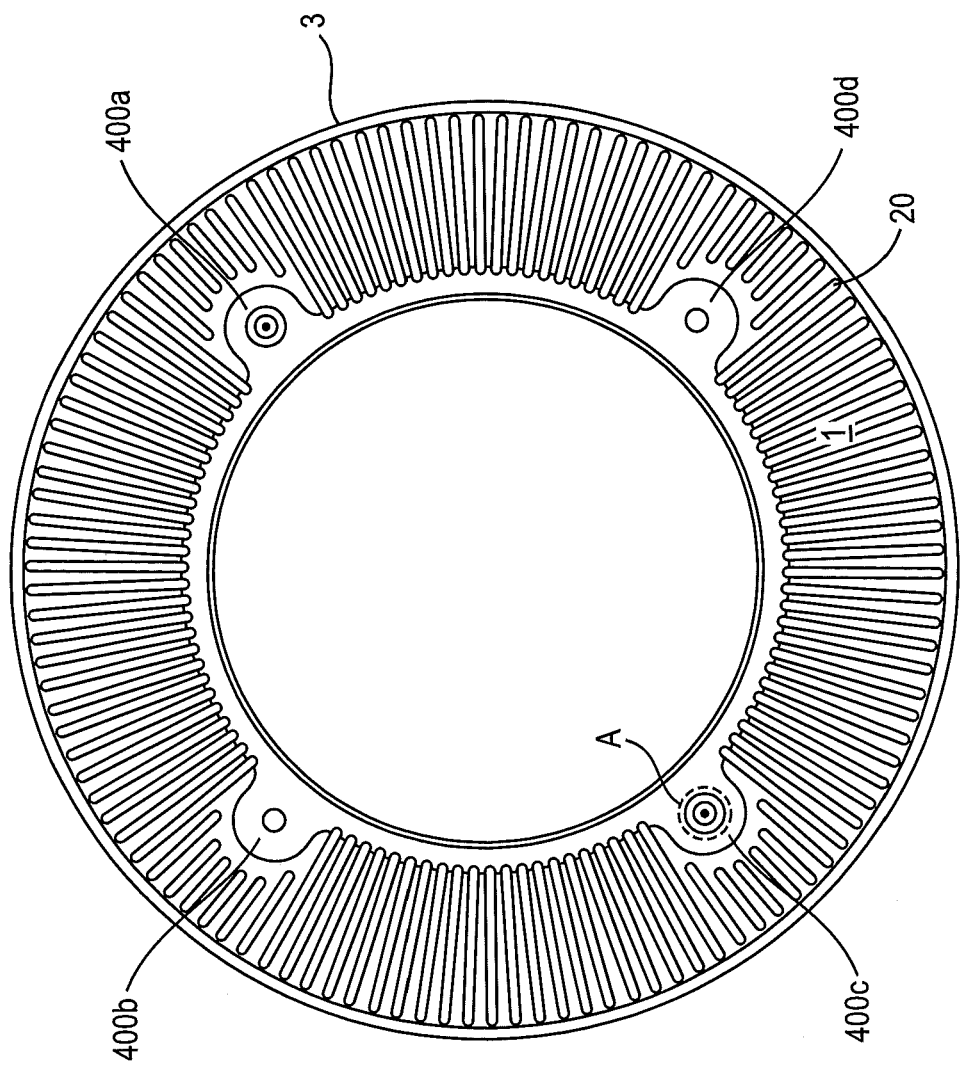
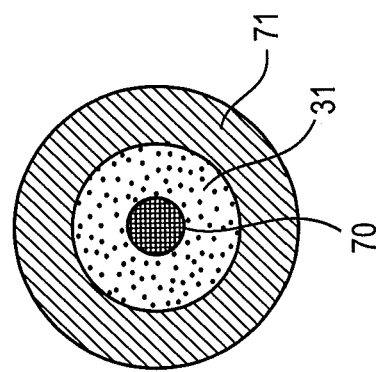
FIG. 8A
FIG. 8B

MOVABLE CHAMBER LINER PLASMA CONFINEMENT SCREEN COMBINATION FOR PLASMA PROCESSING APPARATUSES

BACKGROUND

With each successive semiconductor technology generation, wafer diameters tend to increase and transistor sizes decrease, resulting in the need for an ever higher degree of accuracy and repeatability in wafer processing. Semiconductor substrate materials, such as silicon wafers, are processed by techniques which include the use of vacuum chambers. These techniques include non plasma applications such as electron beam evaporation, as well as plasma applications, such as sputter deposition, plasma-enhanced chemical vapor deposition (PECVD), resist strip, and plasma etch.

Plasma processing systems available today are among those semiconductor fabrication tools which are subject to an increasing need for improved accuracy and repeatability. An important success metric for plasma processing systems is increased uniformity, which includes uniformity of process results on a semiconductor substrate surface as well as uniformity of process results of a succession of wafers processed with nominally the same input parameters. Continuous improvement of on-wafer uniformity is desirable. Among other things, this calls for plasma chambers with improved uniformity, consistency and self diagnostics.

For example, poly-silicon gate etching is driving towards smaller and smaller critical dimension uniformity (CDU) to be achieved across a substrate of about 300 mm in diameter. Such a variation could be due to radial variation in substrate temperature near the edge, plasma chemistry or density, an overhanging edge ring, or other constraints. The CDU requirements are expected to become more stringent with the continuing reduction in node size.

SUMMARY

A chamber liner in a plasma reaction chamber for processing semiconductor substrates is described herein. This chamber liner is symmetric in shape, electrical grounding and temperature. Actuators can move the chamber liner along its axis in order to facilitate substrate loading and unloading. This chamber liner comprises a heater in the proximity of the inner perimeter. The power for the heater and the electrical grounding of the chamber liner are provided through electrical receptacles on the bottom of the chamber liner and electrical wiring inside the actuators.

BRIEF DESCRIPTION OF THE DRAWINGS

FIG. 8A is a bottom view of the chamber liner in FIG. 3.

FIG. 8B is an enlarged view of the portion A in FIG. 8A.

DETAILED DESCRIPTION

Plasma reaction chambers often include a chamber liner. The chamber liner serves several functions.

First, a chamber liner can be used to confine the plasma. The presence of a chamber liner in the proximity of the plasma can change the distribution of the electric field, confine the plasma essentially inside the chamber liner and increase the plasma density.

Second, the chamber liner may be used to protect the plasma reaction chamber by preventing the plasma from eroding other parts of the plasma reaction chamber and thus protect the plasma reaction chamber from damage. A chamber liner is usually a consumable part which can be cleaned and/or replaced periodically.

Third, a chamber liner can enhance the process gas pressure uniformity. The process gas pressure directly affects the reaction rate. Therefore, to maintain a uniform process gas pressure distribution above a semiconductor substrate undergoing plasma processing helps maintain uniform critical dimensions in device dies on the substrate. The pressure in a typical plasma reaction chamber is controlled by introducing process gas and evacuating the chamber at the same time. Without any restriction on process gas flow in the plasma reaction chamber, the process gas pressure may form a gradient from a relatively high pressure near the outlet of the gas feed to a relatively low pressure near the evacuation port. A chamber liner which partially restricts the process gas flow may reduce the pressure gradient inside the chamber liner. Another benefit is that the chamber liner can confine the process gas to a smaller volume and thus lower the feeding rate and consumption rate of the process gas.

These benefits of a chamber liner would depend on various features. For a chamber liner having an outer wall extending above the substrate surface, to achieve a high degree of uniformity of process gas pressure and plasma density, the chamber liner is preferably symmetric and free of openings in the outer wall. Such a symmetric chamber liner, if fixed in place, would block transfer of a substrate into and out of the chamber, hence require breaking the vacuum in the chamber for substrate transfer, and lead to reduced efficiency.

A movable symmetric chamber liner is described herein. This chamber liner can be raised or lowered to allow access to the substrate support from the side when loading and unloading a substrate, thus combining the advantages of a symmetric chamber liner and a side-loading plasma reaction chamber.

Figure 1:
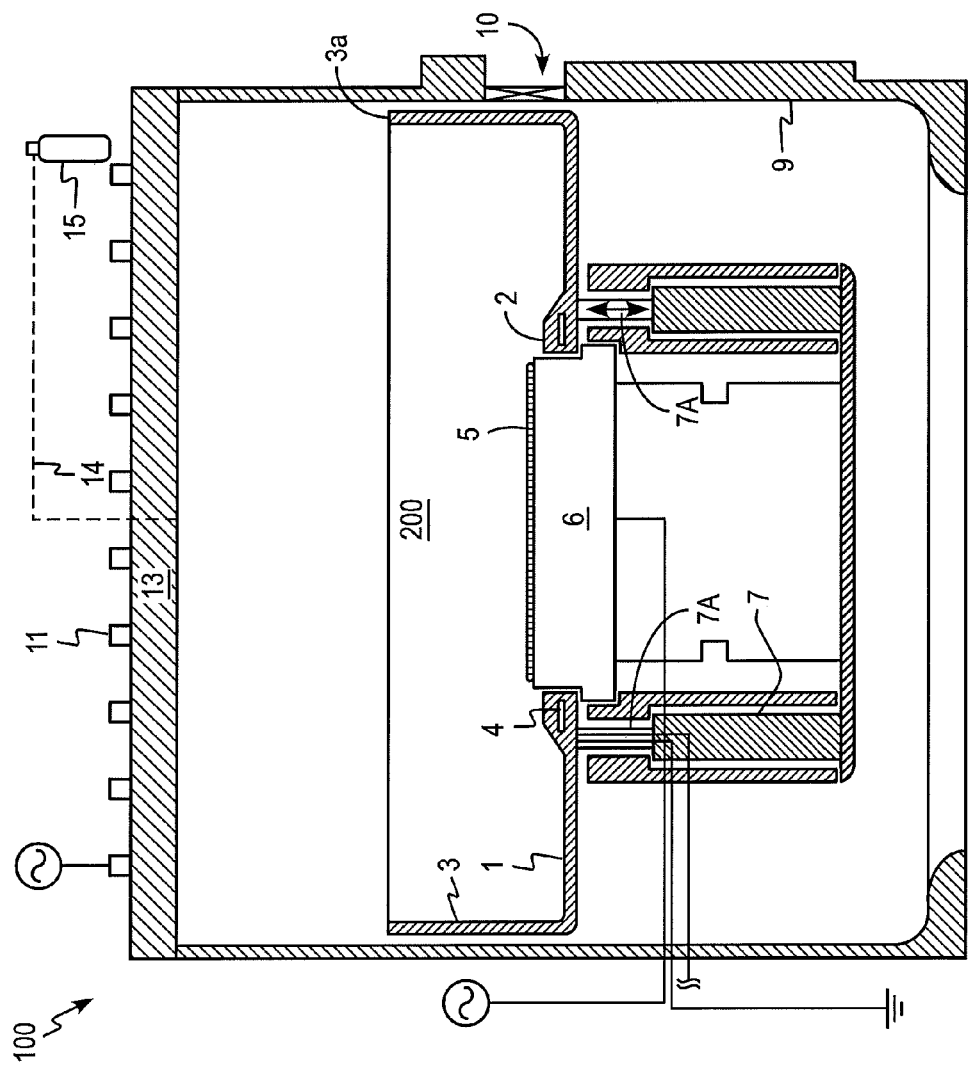
FIG. 1 is a cross sectional schematic of a plasma reaction chamber, comprising a movable, symmetric, and heated chamber liner wherein the chamber liner is at a lower position for normal operation.

FIG. 1 is a cross sectional schematic of a plasma reaction chamber 100, comprising a movable, symmetric, and heated chamber liner 200.

The plasma reaction chamber 100 comprises a chamber wall 9 and a dielectric window 13 (e.g. a planar dielectric window of uniform thickness). Disposed above the dielectric window 13 is an antenna 11. The antenna 11 can be a planar multiturn spiral coil, a non-planar multiturn coil, or an antenna having another shape, powered by a suitable RF source and suitable RF impedance matching circuitry (not shown) that inductively couples RF energy into the chamber 100 to generate a plasma (e.g. a high density plasma). A gas line 14 connected to a gas source 15 supplies process gases into the chamber 100.

Directly below the dielectric window 13, is a semiconductor substrate 5 being processed. The semiconductor substrate 5 is supported on a substrate support 6 incorporating a lower electrode which can be RF biased. The substrate support 6 may comprise one or more dielectric rings (not shown) fitted around its perimeter for electrical insulation and/or coupling RF into the semiconductor substrate and plasma. The detailed structure of the substrate support 6 is not shown for brevity. The substrate support 6 and a plurality of actuators 7 may be enclosed in a supporting member 19 and a removable bottom plate 18 mounted to the chamber wall 9. Electrical connections and gas feeds to the substrate support 6 and actuators 7 may be provided through feedthroughs on the support member 19. An exemplary plasma reaction chamber is described in commonly assigned U.S. Pat. No. 6,013,155, which is hereby incorporated by reference.

Around the substrate support 6 is a movable, symmetric, and heated chamber liner 200. This chamber liner has a bottom wall 1 of uniform thickness, preferably with a plurality of gas passages. A continuous outer cylindrical wall 3 of uniform thickness is free of openings and extends upward axially from an outer perimeter of the bottom wall 1. In order to effectively confine plasma, an upper surface 3a of the cylindrical wall 3 is preferably above the substrate 5 surface. An inner rim 2 of thickness greater than the bottom wall 1 extends upward axially from an inner perimeter of the bottom wall 1. The inner rim 2 houses an embedded heater 4 comprising one or more heating elements and extending entirely or substantially around the inner rim 2. Alternatively (not shown), the inner rim 2 can have the same thickness as the bottom wall 1 with the heater 4 attached on a lower surface of the inner rim 2. The heater 4 is operable to heat the chamber liner 200 to an elevated temperature.

Figure 2:
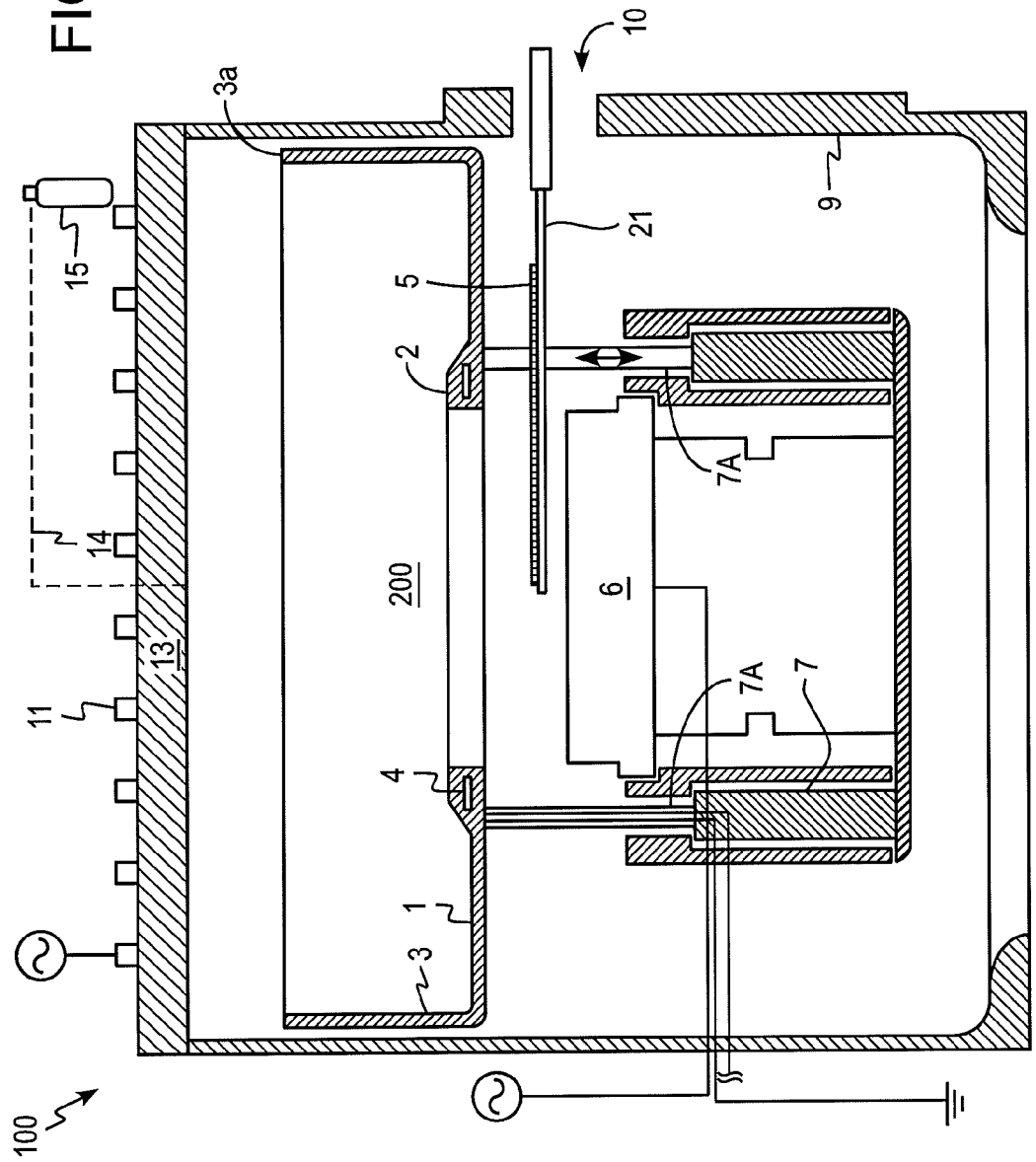
FIG. 2 is a cross sectional schematic of the plasma reaction chamber in FIG. 1, wherein the chamber liner is at an upper position for substrate loading and unloading.

When loading and unloading a substrate, actuators 7 (e.g. four actuators) move the chamber liner 200 along a vertical axis to an upper position where the outer cylindrical wall 3 does not block the substrate loading port 10 (see FIG. 2). However, any suitable drive mechanism can be used to move the chamber liner 200 between the upper and lower positions. In one embodiment, the actuators 7 are pneumatically driven and enclosed in the support member 19. Gas feeds and/or electrical connections are provided through feedthroughs on the support member 19. An actuator arm 7A in each actuator 7 is attached to an electrical receptacle on the lower surface of the bottom wall 1. The actuator arm 7A can be raised or lowered by supplying or not supplying pressurized gas from an external gas source (not shown) to a pneumatically actuated piston or cylinder arranged (not shown) in the actuator 7. In a loading or unloading sequence, the actuator arm 7A is raised to move the chamber liner 200 upward until the outer cylindrical wall 3 clears the substrate loading port 10. The substrate loading port 10 opens and a robotic arm 21 transfers a substrate 5 into or out of the chamber. The substrate support 6 preferably includes lift pins incorporated therein for raising and lowering the substrate 5 above and onto the upper surface of the substrate support 6. After the substrate 5 is lowered onto the upper surface, the actuator arm 7A is lowered to return the chamber liner 200 to its lower position. It should be appreciated that the actuators 7 may be driven by other suitable means, such as by an electric motor, cable actuated lifters, Scotch Yoke mechanisms or the like.

Figure 3:
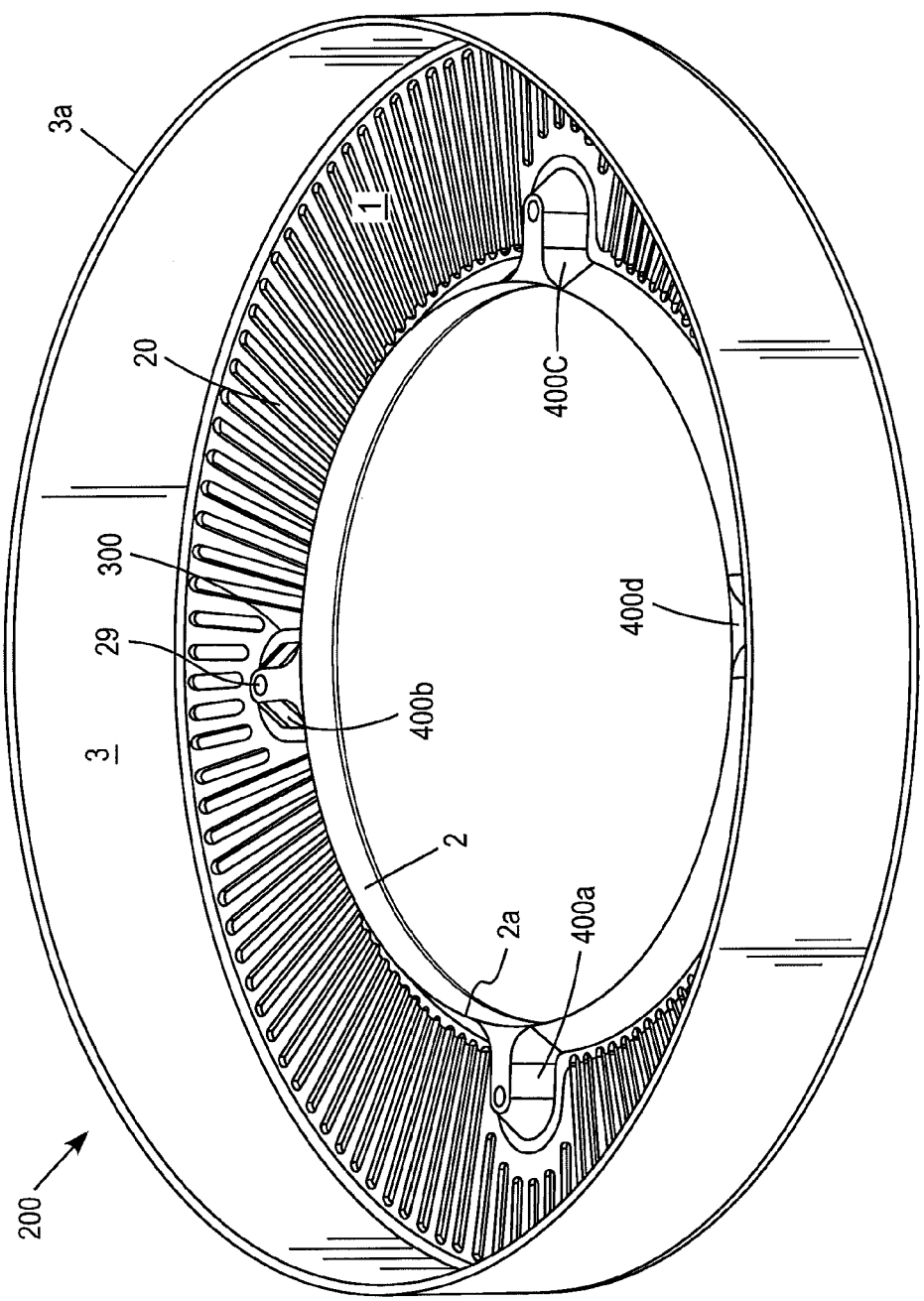
FIG. 3 is an isometric top view of a chamber liner in accordance of one embodiment.
Figure 4:
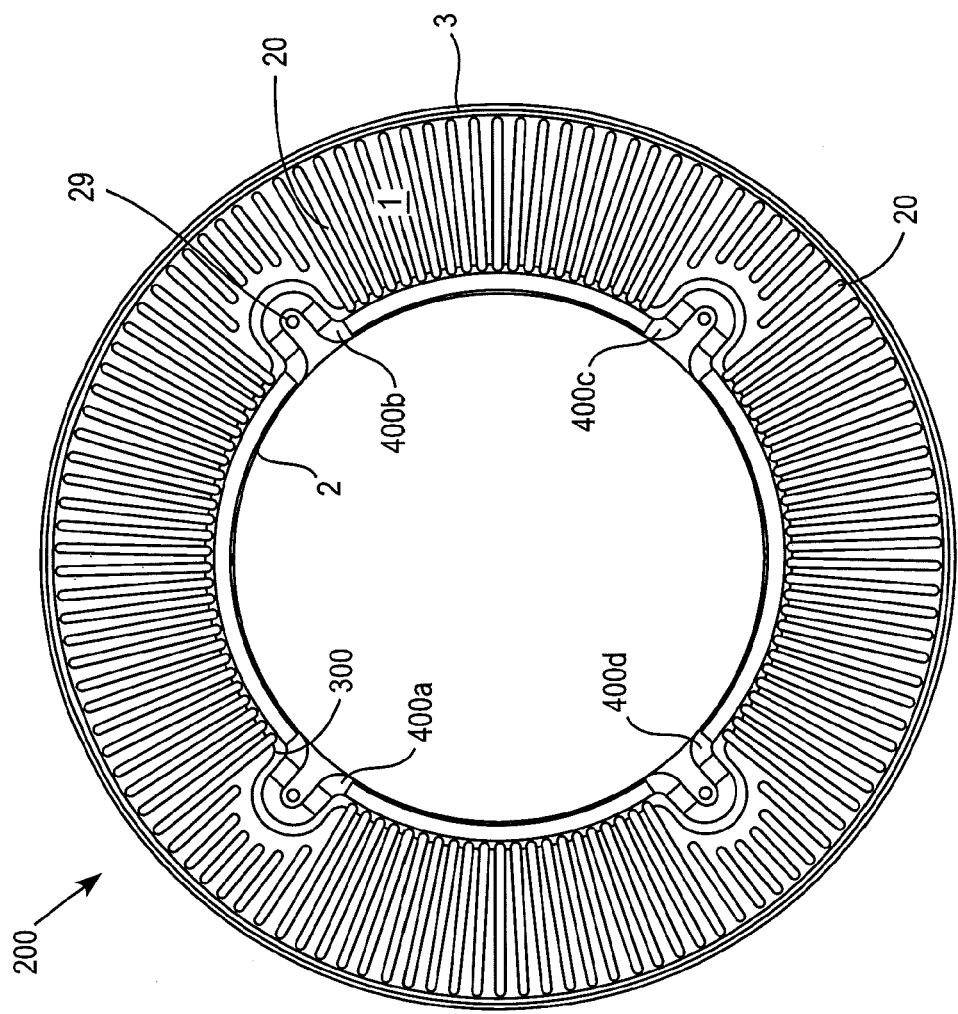
FIG. 4 is a top view of the chamber liner in FIG. 3.

FIGS. 3 and 4 show a perspective view and planar top view, respectively, of an embodiment of the chamber liner 200. In this embodiment, the bottom wall has slot-shaped gas passages 20 arranged in a radial pattern with their longitudinal axes substantially perpendicular to the inner and outer circumference of the chamber liner. These gas passages function as evacuation routes for evacuation of process gas and byproducts. In addition, four bosses 400a, 400b, 400c and 400d, extend radially outward from the inner rim 2. These bosses are arranged 90° apart along the inner rim 2. Each boss comprises an upper surface coextensive with the upper surface 2a of the inner rim 2, a sloped side surface surrounding the perimeter of the boss, and a vertical mounting hole 29. These bosses provide a connection for a low impedance ground return path for the radio frequency (RF) power fed into the plasma reaction chamber. Two of the these bosses (power bosses), 400a and 400c, house electrical leads connected to the heater 4.

The chamber liner 200 can be roughened, anodized, and/or have a ceramic coating (e.g. plasma-sprayed yttria) on at least the plasma exposed surfaces of the bottom wall 1, the outer cylindrical wall 3 and the inner rim 2. A preferred material of the chamber liner 200 is aluminum.

Figure 5:
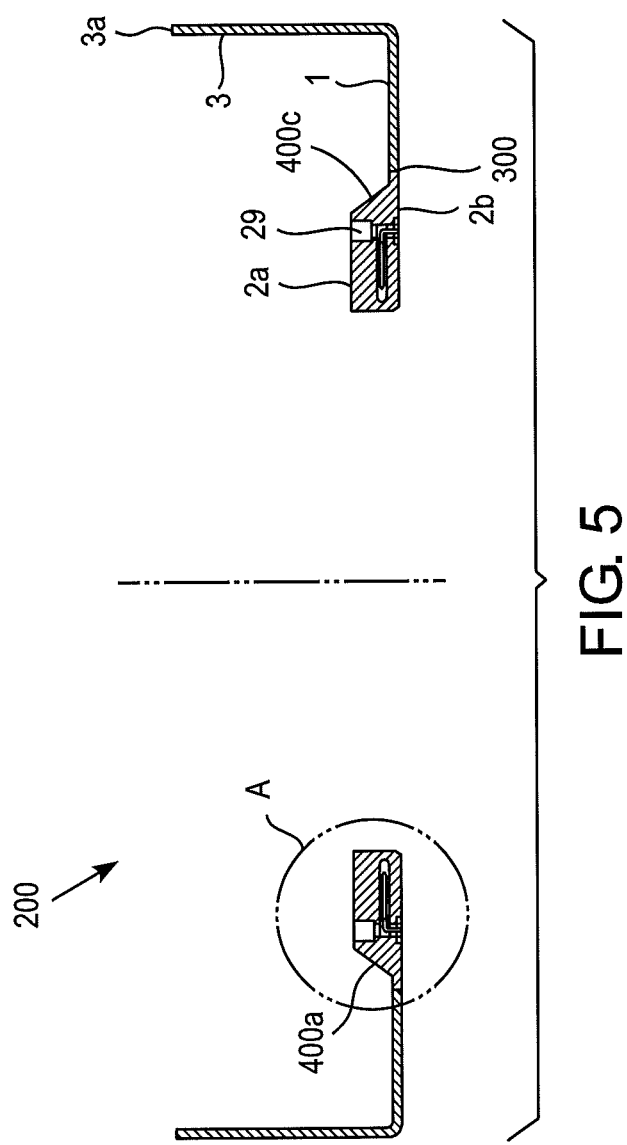
FIG. 5 is a cross sectional schematic of the chamber liner in FIG. 3.
Figure 6:
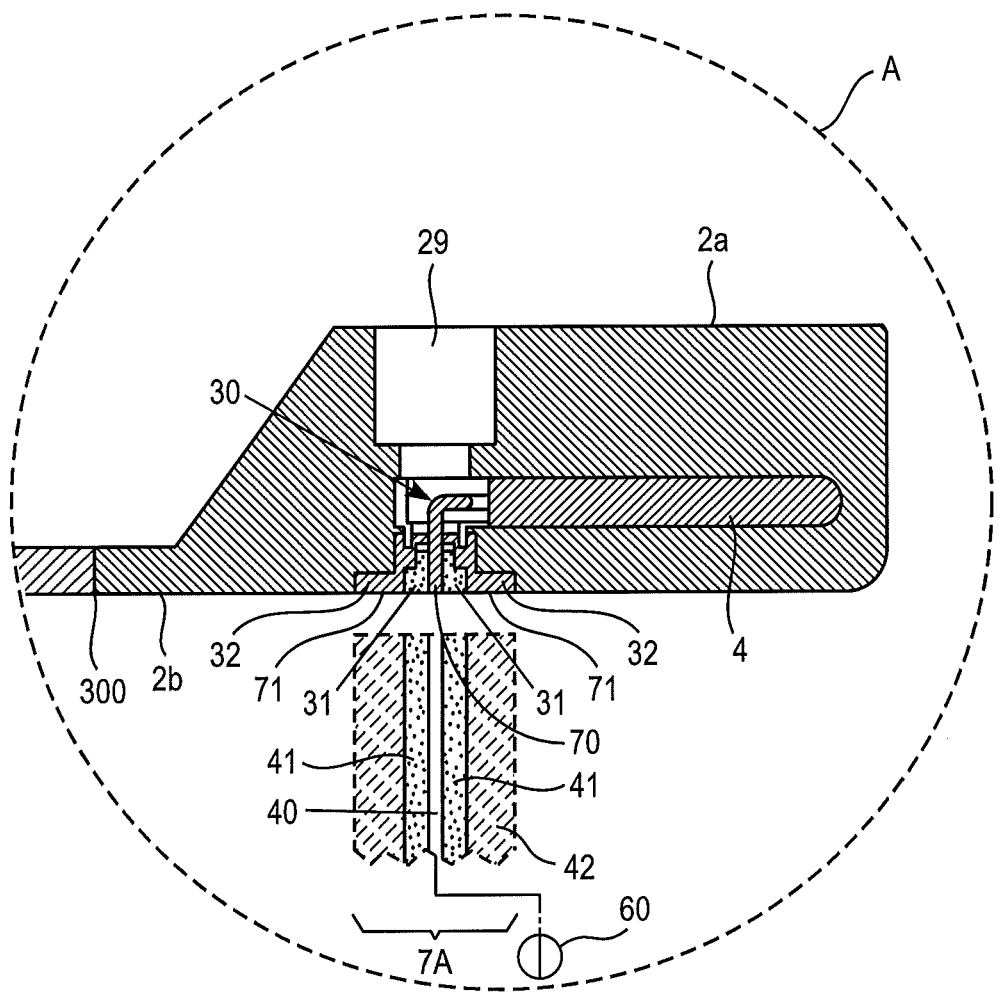
FIG. 6 is an enlarged cross sectional schematic of detail A in FIG. 5.

FIG. 5 shows a cross section through the two power bosses, 400a and 400c, of the chamber liner 200 in FIGS. 3 and 4. The two power bosses, 400a and 400c, are identical. FIG. 6 is an enlarged schematic of the region A in FIG. 5. The circumferentially extending heater 4 is preferably housed or embedded along substantially the entire length of the inner rim 2. In one embodiment, the heater 4 includes two half-circle heating elements, each extending along half of the inner rim 2. Each heating element of the heaters 4 includes radially extending end sections through each power boss, 400a and 400c and the end sections are electrically connected to a power lead 30. The lead 30 is connected to an electrical contact (heater contact) 70 on the lower surface of the liner. Concentric to the heater contact 70 is an annular electrically insulating sleeve 31, which electrically insulates the heater contact 70 from the liner. Concentric to the annular electrically insulating sleeve 31, is a conductor ring 32 (e.g. aluminum), in electrical contact with the liner. This metal ring 32 comprises a lower outer flange whose lower surface 71 (RF ground return button) is coextensive with the lower surface of the liner. The RF ground return button 71 and the heater contact 70 are preferably not anodized so that their exposed surfaces can be plated with a suitable corrosion resistant material, such as Ni, Rh, or Ir. The heater contact 70, insulating sleeve 31 and the RF ground return button 71 form an electrical receptacle in a power boss.

The actuator arms 7A under the power bosses 400a and 400c have a concentric electrode structure, with a center wire 40 connected to a power supply 60 and in electrical and mechanical contact with the heater contact 70, an annular electrically insulating sleeve 41, and an annular conductor 42 connected to the RF ground and in electrical and mechanical contact with the RF ground return button 71.

Figure 7:
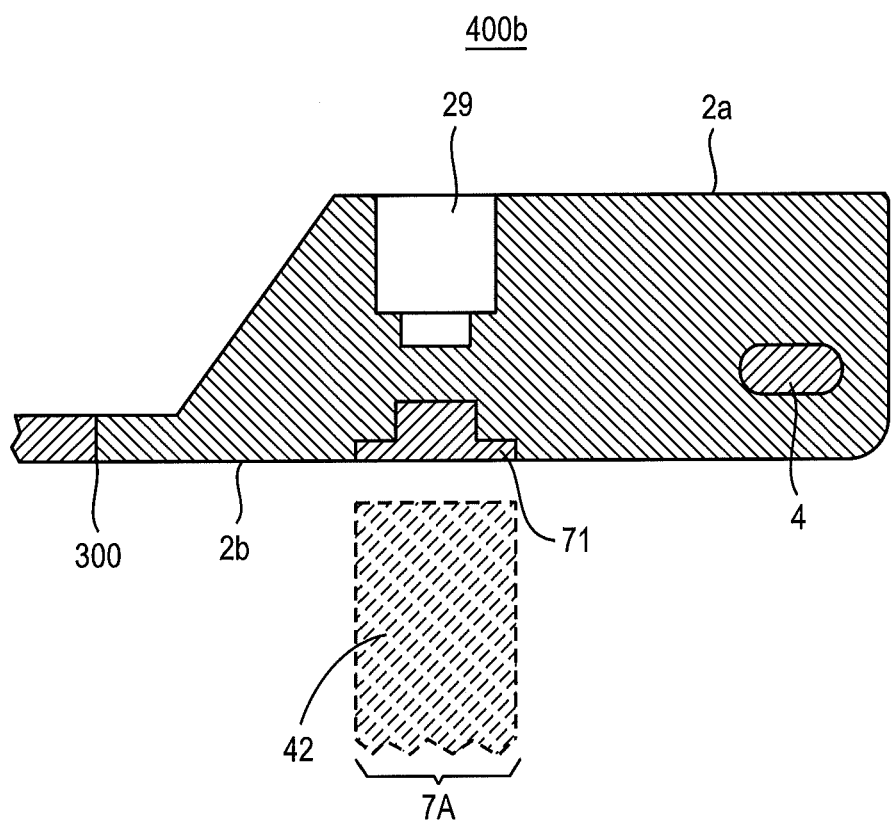
FIG. 7 is an enlarged schematic of a portion of a different cross section of the chamber liner in FIG. 3.

FIG. 7 shows a cross section through the boss 400b. The boss 400d is identical to the boss 400b. The heater 4 is housed or embedded in the inner rim 2. The boss 400b does not comprise a heater contact or house end sections of the heating elements. The RF ground return button 71 in the boss 400b is a circular disk of conductive material, such as non-anodized aluminum, plated with a suitable corrosion resistant material, such as Ni, Rh, or Ir. The RF ground return button 71 can comprise a lower flange coextensive with the lower surface 2b of the liner. In the bosses 400b and 400d, the RF return button 71 alone forms an electrical receptacle.

The actuator arms 7A under the bosses 400b and 400d do not include a wire for supplying power to the heater, but instead include a conductor 42 connected to the RF ground and in electrical and mechanical contact with the RF ground return button 71.

FIG. 8A is the bottom view of the chamber liner 200 in FIGS. 3 and 4. FIG. 8B shows an enlarged bottom view of an electrical receptacle under a power boss 400a or 400c. The heater contact 70 is at the center of the electrical receptacle. The insulator sleeve 31 surrounds the heater contact 70. The RF ground return button 71 surrounds the insulator sleeve 31.

It should be appreciated that any suitable heater arrangement can be used with various electrical connections to one or more heater elements. For example, the heater arrangement could be encased in rim 2 or located on the surface 2b of the rim 2 and/or include a single heating element (e.g., circular rod, patterned film heater or the like), with two terminals connected to two heater contacts in a single boss, while each of the other bosses only comprises a RF ground return button. The RF ground return buttons are preferably arranged symmetrically around the chamber liner to enhance uniformity of plasma confined by the chamber liner.

It is also possible to rearrange the end sections of the heating elements so that they extend vertically directly below the inner rim 2, which eliminates the bosses 400a-d, maintains a circularly symmetric inner rim and enhances the uniformity of the plasma confined by the chamber liner.

The embodiment of the chamber liner depicted in FIGS. 3-8 may be manufactured by the following steps: hydroforming a metal plate to form the bottom wall 1 and the outer cylindrical wall 3; machining a piece of metal or casting molten metal to form the inner rim 2; embedding or attaching the heater 4 to the inner rim 2; welding (e.g. friction-stir welding) the assembly of the bottom wall 1 and the outer cylindrical wall 3 to the inner rim 2 along the welding line 300; machining the slots 20 in the bottom wall 1; optionally anodizing plasma exposed surfaces; and optionally coating plasma exposed surfaces with thermally sprayed yttria.

An exemplary method of processing a semiconductor substrate in the plasma reaction chamber 100 may comprise: (a) transferring a semiconductor substrate 5 into the plasma reaction chamber 100 and lowering the semiconductor substrate 5 onto the substrate support 6; (b) moving the chamber liner 200 to a lower position by lowering the actuator arms 7a; (c) heating the chamber liner 200 to a desired temperature (e.g. from 20 to 50° C., from 50 to 100° C., or from 100 to 200° C.) by activating the heater 4; (d) feeding a process gas into the chamber 100 and generating a plasma with the RF power source; (e) processing (e.g. plasma etching) the semiconductor substrate 5 with the plasma; (f) moving the chamber liner 200 with the actuator 7 to an upper position; (g) transferring the semiconductor substrate 5 out of the plasma reaction chamber 100; and repeating (a)-(g) with another substrate.

While the invention has been described in detail with reference to specific embodiments thereof, it will be apparent to those skilled in the art that various changes and modifications can be made, and equivalents employed, without departing from the scope of the appended claims. For instance, the movable liner can be incorporated in a capacitively coupled plasma chamber.

We claim:

1. A movable chamber liner configured to fit around a perimeter of a substrate support, in a plasma reaction chamber useful for processing a semiconductor substrate, the chamber liner comprising:
   an annular bottom wall with a plurality of gas passages, the annular bottom wall configured to be below a substrate-supporting surface of the substrate support when the movable chamber liner is in a lower position in the plasma reaction chamber;
   a continuous outer cylindrical wall free of openings therethrough extending axially upward from an outer perimeter of the bottom wall, an upper surface of the outer cylindrical wall extending above the substrate-supporting surface of the substrate support when the movable chamber liner is in the lower position;
   an inner rim extending axially upward from an inner perimeter of the bottom wall, an uppermost surface of the inner rim not extending above the substrate-supporting surface of the substrate support when the movable chamber liner is in the lower position;
   a heater supported by the inner rim and operable to heat the movable chamber liner to an elevated temperature;
   at least one electrical receptacle on a lower surface of the liner, comprising one or more conductive contacts (heater contacts) electrically connected to the heater and electrically insulated from the liner;
   at least one electrical receptacle on the lower surface of the liner, comprising a conductive contact (RF ground return button) electrically connected to the liner and electrically insulated from any heater contacts; wherein
   each electrical receptacle is adapted to be attached to one of a plurality of vertically movable actuators, wherein the plurality of vertically movable actuators are configured to move the chamber liner along its axis to an upper position to allow loading and unloading of a semiconductor substrate; wherein:
   at least one of the actuators comprises a lead configured to be electrically connected to a heater contact in one of the electrical receptacles and to a power supply;
   at least one of the actuators comprises another lead configured to be electrically connected to another heater contact in one of the electrical receptacles and to the electrical ground;
   each of the actuators comprises a lead configured to be electrically connected to a RF return button in an electrical receptacle and to the RF ground.

2. The movable chamber liner of claim 1, wherein the inner rim includes a sloped surface which extends axially upward from the inner perimeter of the bottom wall.

3. The movable chamber liner of claim 1, wherein the heater is embedded in the inner rim.

4. The movable chamber liner of claim 1, wherein the inner rim comprises four radially outwardly extending bosses spaced 90° apart, at least one of the bosses housing electrical connections to the heater.

5. The movable chamber liner of claim 1, wherein the outer cylindrical wall and the bottom wall consist of a single plate of hydroformed aluminum.

6. The movable chamber liner of claim 1, wherein the inner rim is friction-stir welded to the bottom wall.

7. The movable chamber liner of claim 1, wherein the electrical receptacles are azimuthally symmetrically positioned.

8. The movable chamber liner of claim 1, wherein the material of the exposed surfaces of the heater contacts and the exposed surfaces of the RF ground return buttons is nickel, rhodium, iridium or alloy thereof.

9. The movable chamber liner of claim 1, wherein:
   two of the electrical receptacles comprise heater contacts and;
   each of the electrical receptacles comprises a RF ground return button.

10. The movable chamber liner of claim 1, wherein the openings in the bottom wall are slots arranged in a radial pattern and their longitudinal axes are substantially perpendicular to inner and outer circumferences of the chamber liner.

11. The movable chamber liner of claim 1, wherein the bottom wall, the outer cylindrical wall and the inner rim are anodized aluminum, or roughened and anodized aluminum.

12. The movable chamber liner of claim 1, wherein the heater comprises two semicircular heater elements.

13. The movable chamber liner of claim 1, wherein plasma exposed surfaces of the bottom wall, the outer cylindrical wall and the inner rim are coated with a ceramic coating.

14. A plasma reaction chamber, comprising:
- the movable chamber liner of claim 1;
- a substrate support on which the semiconductor substrate is supported;

at least one radio frequency (RF) power source adapted to energize at least one species of process gas into a plasma during operation of the plasma reaction chamber,
- where the plasma is useful for processing the semiconductor substrate;

a cylindrical chamber wall.

15. The plasma reaction chamber of claim 14, wherein the actuators are pneumatically driven.

* * * * *